United States Patent
Jain et al.

(10) Patent No.: US 9,331,679 B1
(45) Date of Patent: May 3, 2016

(54) HIGH-SPEED FLYING-CAP LEVEL SHIFTER

(71) Applicant: FREESCALE SEMICONDUCTOR, INC., Austin, TX (US)

(72) Inventors: Mayank Jain, Haryana (IN); Anil Kumar Gottapu, Andhra Pradesh (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/714,341

(22) Filed: May 17, 2015

(51) Int. Cl.
*H03L 5/00* (2006.01)
*H03K 3/356* (2006.01)
*H03K 19/0185* (2006.01)
*H03K 3/012* (2006.01)

(52) U.S. Cl.
CPC .......... *H03K 3/356104* (2013.01); *H03K 3/012* (2013.01); *H03K 3/356113* (2013.01); *H03K 19/018521* (2013.01)

(58) Field of Classification Search
CPC .................. H03K 3/356113; H03K 19/00315; H03K 17/102; H03K 3/012
USPC ........... 326/61–62, 80–81; 327/303, 306, 333
See application file for complete search history.

(56) References Cited

U.S. PATENT DOCUMENTS

| | | | |
|---|---|---|---|
| 4,045,691 A | 8/1977 | Asano | |
| 4,064,405 A | 12/1977 | Cricchi | |
| 4,574,273 A | 3/1986 | Atsumi | |
| 6,049,228 A | 4/2000 | Moon | |
| 6,201,429 B1 | 3/2001 | Rosenthal | |
| 6,864,718 B2 * | 3/2005 | Yu | H03K 3/356113 326/62 |
| 7,449,933 B2 * | 11/2008 | Goncalves | H03K 3/356113 327/333 |
| 7,463,072 B2 | 12/2008 | Kim | |
| 8,363,441 B2 | 1/2013 | Ohashi | |
| 8,427,235 B2 | 4/2013 | Williams | |
| 8,710,910 B2 | 4/2014 | Wang | |
| 8,847,661 B2 * | 9/2014 | Choung | H03K 3/01 326/62 |

* cited by examiner

*Primary Examiner* — Dinh T Le
(74) *Attorney, Agent, or Firm* — Charles E. Bergere

(57) ABSTRACT

A flying cap, level shifter has a capacitor with an upper plate connected to (i) a hybrid power supply (VDDH-VDDL) by an n-type transistor and (ii) a relatively high-voltage power supply VDDH by a p-type transistor. Both of the transistors are controlled by a voltage at the level shifter's output node, which is driven to either VDDH or ground. As such, one of the two transistors will always be on, such that the flying capacitor will be continuously recharged to a voltage difference that ensures that the level shifter will operate properly.

15 Claims, 3 Drawing Sheets

300

HIGH-SPEED FLYING-CAP LEVEL SHIFTER

BACKGROUND

The present invention relates to integrated circuits and, more particularly, to a flying-cap type voltage level shifter.

A rising level shifter converts an input signal in a voltage domain having a supply voltage level VDDL to an output signal in a voltage domain having a supply voltage level VDDH, where VDDH is greater than VDDL. A flying-cap rising level shifter is a particular type of rising level shifter that employs a capacitor to increase the speed at which a transition in the input signal (from either high (i.e., logic 1) to low (i.e., logic 0) or from low to high) will appear as a similar or inverted transition in the output signal.

FIG. 1 is a schematic circuit diagram of a conventional flying-cap rising level shifter 100 that converts an input signal IN in a low-voltage domain VDDL to an output signal OUT in a high-voltage domain VDDH. The level shifter 100 has an inverter INV that operates in the low-voltage domain VDDL, and a p-type transistor (e.g., PMOS) P1 and a n-type transistor (e.g., NMOS) N1 that operate in the high-voltage domain VDDH. A capacitor C1 is realized using metals, MOS devices, or other suitable non-semiconductor/semiconductor devices.

In operation, the capacitor C1 is pre-charged to a voltage equivalent to the voltage difference between VDDH and VDDL, i.e., (VDDH-VDDL), using capacitor-charging circuitry (not shown in FIG. 1). If the input signal IN is initially high, then the output of the inverter INV will be low, the transistor N1 will be off, and the upper plate of the capacitor C1 and the gate voltage applied to the transistor P1 will be (VDDH-VDDL), which turns on the transistor P1 and drives the output signal OUT high. This does not work in case where the p-type threshold voltage Vtp>VDDL, but in that case, a normal inverter can be used for level shifting.

When the input signal IN goes from high to low, the output of the inverter INV and the lower plate of the capacitor C1 will be driven high. Since the capacitor C1 was pre-charged to (VDDH-VDDL), when the lower plate of the capacitor C1 is driven towards VDDL, the upper plate will be driven towards VDDH, which will turn off the transistor P1. At the same time, the output of the inverter INV being driven towards VDDL will turn on the transistor N1, which will drive the output signal OUT low.

When the input signal IN next switches from low to high, the output of the inverter INV will again be driven low, and the transistor N1 will turn off. At the same time, assuming that the capacitor C1 is still charged with a voltage difference of (VDDH-VDDL), when the lower plate of the capacitor C1 is driven low, the upper plate will be driven back towards (VDDH-VDDL), which will turn the transistor P1 back on, which will drive the output signal OUT back towards VDDH. And so on for subsequent transitions in the input signal IN.

As mentioned previously, the capacitor C1 is initially pre-charged to (VDDH-VDDL) using capacitor-charging circuitry that is not shown in FIG. 1. Not only does that capacitor-charging circuitry need to pre-charge the capacitor C1, but it must also make sure that the capacitor C1 stays charged to a desired voltage level, such as (VDDH-VDDL). Otherwise, inevitable parasitic leakage current will result in the capacitor C1 discharging to an undesired voltage level at which the transistor P1 will not be able to be switched off when the input signal IN transitions from high to low, and the level shifter 100 will not operate properly.

FIG. 2 is a schematic circuit diagram of a conventional cross-coupled pMOS-based rising level shifter 200 that converts an input signal IN in a low-voltage domain VDDL to an output signal OUT in a high-voltage domain VDDH. One of the disadvantages of the level shifter 200 is that the delay for transitions from low to high is typically significantly different from the delay for transitions from high to low. In other words, the time that it takes for a low-to-high transition in the input signal IN to be reflected in a low-to-high transition in the output signal OUT is typically significantly different from the time that it takes for a high-to-low transition in the input signal IN to be reflected in a high-to-low transition in the output signal OUT. This delay skew can lead to timing errors and data errors in downstream circuitry.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Figure 1:
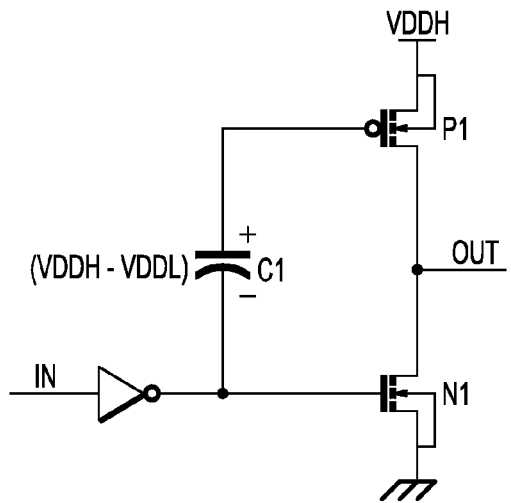
FIG. 1 is a schematic circuit diagram of a conventional flying-cap rising level shifter.
Figure 2:
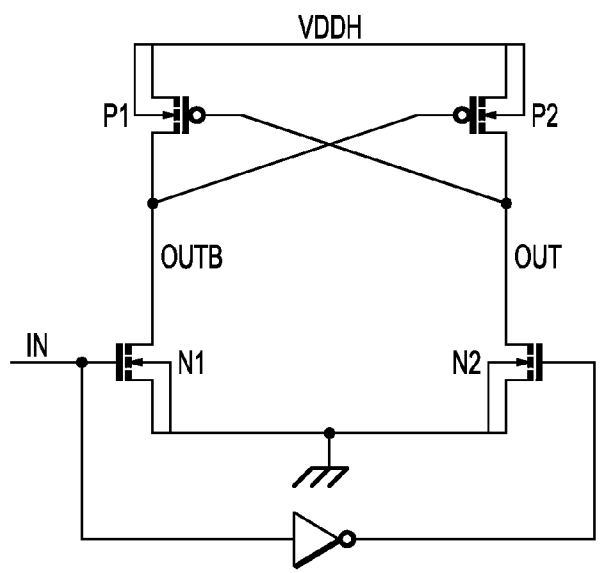
FIG. 2 is a schematic circuit diagram of a conventional cross-coupled pMOS-based rising level shifter.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, a level shifter converts an input signal at an input node into an output signal at an output node, where (i) the input signal is in a low-voltage domain having a low supply voltage and (ii) the output signal is in a high-voltage domain having a high supply voltage, where the high supply voltage is greater than the low supply voltage. The level shifter comprises (1) a capacitor having a lower plate connected to the low-voltage domain and an upper plate; (2) a first transistor whose channel is connected between a first supply voltage and the upper plate of the capacitor; and (3) a second transistor whose channel is connected between a second supply voltage and the upper plate of the capacitor. When the input signal is high, the first transistor is driven on to connect the first supply voltage to the upper plate of the capacitor, and, when the input signal is low, the second transistor is driven on to connect the second supply voltage to the upper plate of the capacitor, thereby maintaining sufficient charge in the capacitor for proper operation of the level shifter.

In another embodiment, the present invention provides a method for converting an input signal at an input node into an output signal at an output node, where (i) the input signal is in a low-voltage domain having a low supply voltage and (ii) the output signal is in a high-voltage domain having a high supply voltage, where the high supply voltage is greater than the low supply voltage. The method comprises (a) applying a high input signal to the input node, which turns on a first transistor whose channel is connected between a first supply voltage and an upper plate of a capacitor; and (b) applying a low input signal to the input node, which turns on a second transistor whose channel is connected between a second supply voltage and the upper plate of the capacitor, thereby maintaining sufficient charge in the capacitor for proper operation of the level shifter.

Figure 3:
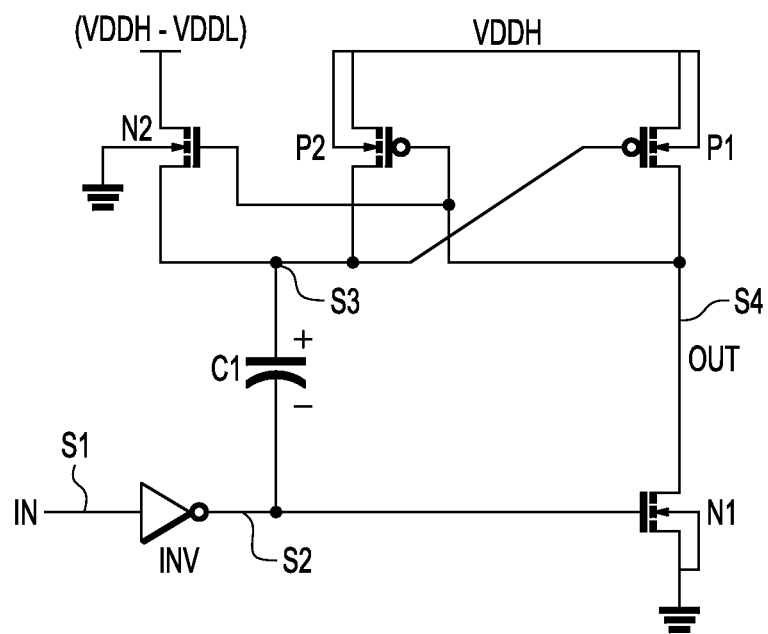
FIG. 3 is a schematic circuit diagram of a flying-cap rising level shifter according to one embodiment of the invention.

Referring now to FIG. 3, a schematic circuit diagram of a flying-cap rising level shifter 300 according to one embodiment of the present invention is shown. Like the level shifter 100 of FIG. 1, the level shifter 300 converts an input signal IN in a low-voltage domain that has a low supply voltage VDDL to an output signal OUT in a high-voltage domain that has a high supply voltage VDDH. The level shifter 300 includes an inverter INV that operates in the low-voltage domain and has an input connected an input node and an output connected to a lower plate of a capacitor C1. The level shifter 300 also includes two p-type transistors P1 and P2 and an n-type transistor N1 that preferably operate in the high-voltage domain, and a n-type transistor N2 that operates in a hybrid voltage domain driven by a voltage difference (VDDH-VDDL).

Transistors N1, N2, P1, and P2 can be implemented using any suitable transistor devices, such as (without limitation) metal-oxide semiconductor (MOS) transistors realized with different technology options like bulk process, finfet, smart mos, etc. The capacitor C1 can be implemented using any suitable structures such as (without limitation) parallel metal plates or MOS devices.

In more detail, the level shifter 300 comprises the inverter INV and the capacitor C1. The inverter INV has an input terminal connected to an input node S1 for receiving an input signal IN, and an output terminal connected to a second node S2. The capacitor C1 has a lower plate connected to the node S2 and an upper plate connected to the channels of the transistors N2 and P2 at a third node S3. The other end of the channel of the transistor N2 is connected to a voltage VDDH-VDDL, which is the voltage difference between the supply voltages of the high and low voltage domains. The other end of the channel of the transistor P2 is connected to the high supply voltage VDDH. The gates of the transistors N2, P2 are connected together and to an output node S4. In the embodiment shown, the transistor N2 has a bulk connected to ground and the transistor P2 has a bulk connected to the high supply voltage VDDH.

The level shifter 300 also includes the transistors N1 and P1. The transistor N1 has a gate connected to the node S2 and its channel connected between ground and the output node S4. A bulk of the transistor N1 may be connected to ground. The transistor P1 has a gate connected to the upper plate of the capacitor C1 by way of the third node S3 and its channel is connected at one end to the output node S4 (and thus to the channel of the transistor N1) and at the other end to the high supply voltage VDDH. A bulk of the transistor P1 may be connected to the high supply voltage VDDH.

Figure 4:
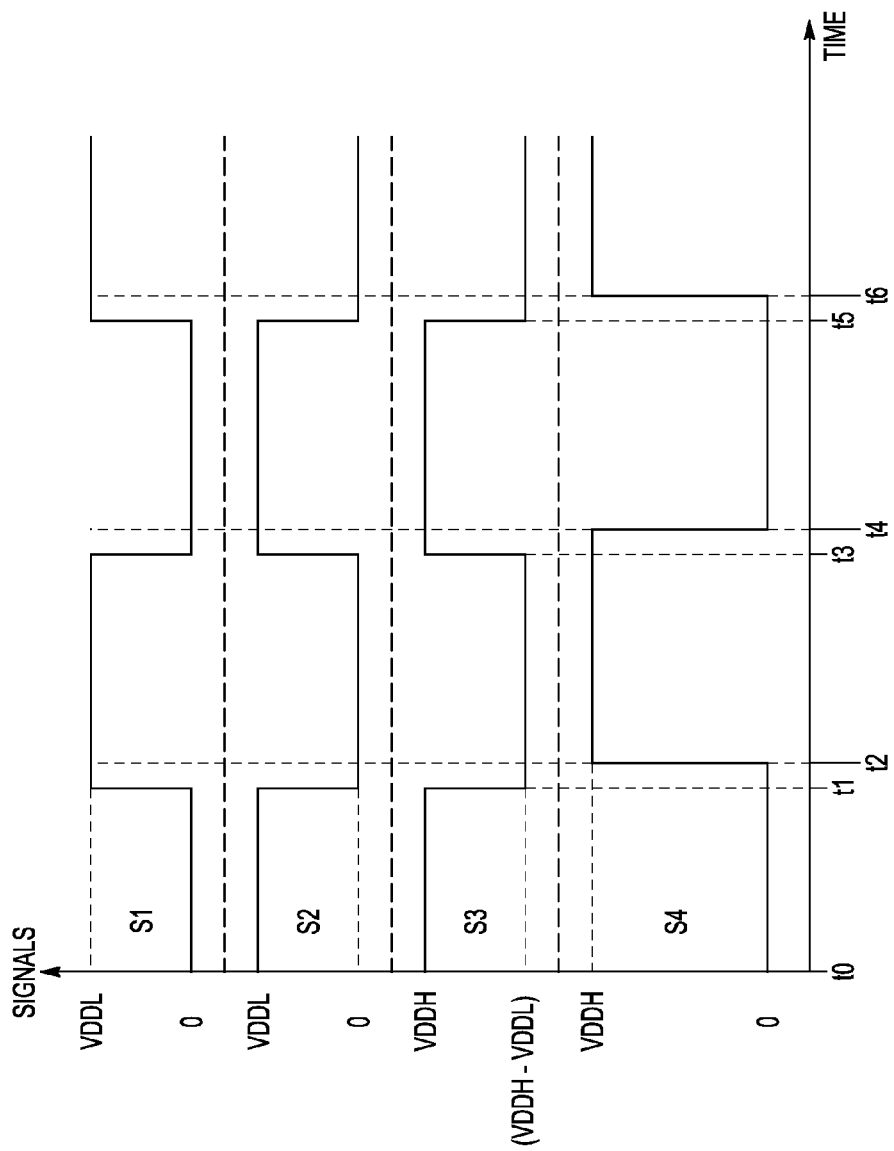
FIG. 4 is a timing diagram illustrating voltage levels at four different nodes in the level shifter of FIG. 3.

FIG. 4 is a timing diagram illustrating the voltage levels at the four nodes S1-S4 in the level shifter 300 of FIG. 3:

Node S1 is the voltage level of the input signal IN;

Node S2 is the voltage level at the output of the inverter INV, which is also the voltage level at the gate of the transistor N1 and of the lower plate of the capacitor C1;

Node S3 is the voltage level of the upper plate of the capacitor C1, which is also the voltage level at the gate of the transistor P1, the drain of the transistor P2, and the drain of the transistor N2; and Node S4 is the voltage level of the output signal OUT, which is also the voltage level of the drains of the transistors P1 and N1 and the gates of transistors P2 and N2.

The operation of the level shifter 300 is described below in the context of the timing diagram of FIG. 4.

To operate the level shifter 300, the capacitor C1 does not have to be pre-charged to any voltage by any special capacitor-charging circuitry that is external to the level shifter 300. We can assume, for example, that, at the start of operations, the capacitor C1 is fully discharged having a zero-voltage difference across its upper and lower plates.

At time t0 of FIG. 4, the input signal IN (node S1) is low (e.g., ground) in the low-voltage domain. In that case, the output of the inverter INV (node S2) will be high in the low-voltage domain (e.g., approximately VDDL), which will turn on the transistor N1, which will drive the output signal OUT (node S4) low (e.g., ground) in the high-voltage domain, which will turn on the transistor P2, which will charge the upper plate of the capacitor C1 (node S3) to VDDH, which will result in a voltage difference of (VDDH-VDDL) (i.e., VDDL, when VDDH=2*VDDL) across the plates of the capacitor C1. With the node S4 low, the transistor N2 will be off, and, with the node S3 at VDDH, the transistor P1 will also be off. Note that, depending on the particular implementation, ground in the low-voltage domain might or might not be the same as ground in the high-voltage domain.

At time t1, the input signal IN switches from low to high (i.e., VDDL). In that case, the output of the inverter INV (node S2) will quickly switch from high to low, which will turn off the transistor N2. Since the capacitor C1 was just charged to (VDDH-VDDL), when the lower plate of the capacitor C1 is driven low, the upper plate (node S3) will be quickly driven to (VDDH-VDDL), which will turn on the transistor P1, which will drive the output signal OUT (node S4) to VDDH at time t2, which will turn off the transistor P2 and turn on the transistor N2, ensuring that the upper plate of the capacitor C1 remains at (VDDH-VDDL) (i.e., VDDL when VDDH=2*VDDL) and the voltage difference stored in the capacitor C1 remains at (VDDH-VDDL). Note that there is a time delay between (i) the input signal IN going from low to VDDL at time t1 and (ii) the output signal OUT going from low to VDDH at time t2, but that time delay is much shorter (e.g., 4-5 times shorter) than the time delay associated with conventional, non-flying-cap level shifters.

At time T3, the input signal IN (node S1) switches from high back to low. In that case, the output of the inverter INV (node S2) will quickly switch from low back to VDDL. Since the voltage difference of the capacitor C1 has been charged to (VDDH-VDDL), when the lower plate of the capacitor C1 is driven towards VDDL, the upper plate (node S3) will be quickly driven towards VDDH, which will turn off the transistor P1. At the same time, the output of the inverter INV being driven towards VDDL will turn on the transistor N1, which will drive the output signal OUT (node S4) low at time t4. Driving the node S4 low turns off the transistor N2, but turns on the transistor P2, which charges the upper plate of the capacitor C1 (node S3) to VDDH, which turns the transistor P1 off. At this point, the voltage difference across the two plates of the capacitor C1 will be (VDDH-VDDL) (i.e., VDDL, when VDDH=2*VDDL).

Note that, here too, there is a time delay between (i) the input signal IN going from VDDL to low at time t3 and (ii) the output signal OUT going from VDDH to low at time t4, but that time delay is still much shorter (e.g., 4-5 times shorter) than the time delay associated with conventional, non-flying-cap level shifters. Moreover, in the level shifter 300, the time delay (e.g., t2-t1) for the transition from low to high is substantially similar to the time delay (e.g., t4-t3) for the transition from high to low. This is not the case for a conventional cross-coupled PMOS-based rising level shifter, where the time delay for transitions from low to high is typically substantially different from the time delay for transitions from high to low.

The scenario for the input and output transitions from low to high at times t5 and t6 of FIG. 4 is analogous to the scenario described previously for the similar transitions at times t1 and t2. And so on for subsequent transitions.

Note that, in the level shifter 300, at all times, either the transistor N2 is on or the transistor P2 is on. Furthermore, when the transistor N2 is on, the capacitor C1 will be charged to have a voltage difference of (VDDH-VDDL), and, when the transistor P2 is on, the capacitor C1 will also be charged to have a voltage difference of (VDDH-VDDL). Thus, in the level shifter 300, the flying capacitor C1 is continuously being charged to have a voltage difference of (VDDH-VDDL) at which the level shifter 300 will operate properly. As such, even when charge is continuously being discharged from the capacitor C1 due to parasitic leakage current, the lost charge will be replaced either (i) by power supply (VDDH-VDDL) via the transistor N2 or (ii) by power supply VDDH via the transistor P2.

In general, VDDL must be greater than the threshold voltage of the transistor N1 to ensure that the high-voltage domain transistor N1 will be turned on when the node S2 is at VDDL (i.e., when the input signal IN is low). Furthermore, VDDL must also be high enough such that the high-voltage domain transistor P1 is switched ON when the node S3 is at (VDDH-VDDL) and P1's source-to-gate voltage Vsg is at VDDL. Moreover, the transistor N2 must be able to withstand a gate voltage of VDDH.

Although, in the level shifter 300, the inverter INV is connected to receive the input signal IN in the low-voltage domain, in another embodiment of the invention, a level shifter can instead have an inverter connected to receive the output signal OUT in the high-voltage domain. In fact, as would be understood by those skilled in the art, level shifters of the invention can have any odd number of inverters with zero, one, or more of those inverters connected at the level-shifter input in the low-voltage domain and the rest of those inverters connected at the level-shifter output in the high-voltage domain. The odd number of inverters insures that the polarity of the input signal IN matches the polarity of the output signal OUT. If an inverting level shifter is desired, then an even number (including the number zero) of inverters can be distributed between the input and the output sides of the level shifter.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A level shifter that converts an input signal at an input node of the level shifter into an output signal at an output node of the level shifter, wherein (i) the input signal is in a low-voltage domain having a low supply voltage and (ii) the output signal is in a high-voltage domain having a high supply voltage, where the high supply voltage is greater than the low supply voltage, the level shifter comprising:
   a capacitor having a lower plate connected to the low-voltage domain for receiving the input signal and an upper plate;
   a first transistor having a channel connected between a first supply voltage and the upper plate of the capacitor, and a gate connected to the output node; and
   a second transistor having a channel connected between a second supply voltage and the upper plate of the capacitor, and a gate connected to the gate of the first transistor and to the output node, wherein when the input signal is high, the first transistor is driven on to connect the first supply voltage to the upper plate of the capacitor, and, when the input signal is low, the second transistor is driven on to connect the second supply voltage to the upper plate of the capacitor.

2. The level shifter of claim 1, wherein the first and second transistors are of opposite types.

3. The level shifter of claim 2, wherein:
   the first transistor is an n-type transistor; and
   the second transistor is a p-type transistor.

4. The level shifter of claim 1, wherein:
   the first supply voltage is a voltage difference between the high supply voltage and the low supply voltage; and
   the second supply voltage is the high supply voltage.

5. The level shifter of claim 1, further comprising:
   at least one inverter in the low-voltage domain and connected between the input node and the lower plate of the capacitor for providing the input signal to the lower plate of the capacitor.

6. The level shifter of claim 1, wherein:
   the level shifter has first and second branches;
   the first branch comprises the capacitor and the first and second transistors;
   the second branch comprises:
      a third transistor having a channel connected between the second supply voltage and the output node and a gate connected to the upper plate of the capacitor; and
      a fourth transistor having a channel connected between the output node and ground and a gate connected to the lower plate of the capacitor.

7. The level shifter of claim 6, wherein:
   the first and fourth transistors are n-type transistors;
   the second and third transistors are p-type transistors;
   the first supply voltage is a voltage difference between the high supply voltage and the low supply voltage;
   the second supply voltage is the high supply voltage; and
   further comprising an inverter in the low-voltage domain and connected between the input node and the lower plate of the capacitor.

8. A method for converting an input signal at an input node of a level shifter into an output signal at an output node of the level shifter, wherein (i) the input signal is in a low-voltage domain having a low supply voltage and (ii) the output signal is in a high-voltage domain having a high supply voltage, wherein the high supply voltage is greater than the low supply voltage, the method comprising:
   (a) applying a high input signal to the input node, which turns on a first transistor of the level shifter, wherein the first transistor has a channel connected between a first supply voltage and an upper plate of a capacitor of the level shifter, and a gate connected to the output node; and
   (b) applying a low input signal to the input node, which turns on a second transistor of the level shifter, wherein the second transistor has a channel connected between a second supply voltage and the upper plate of the capacitor, and a gate connected to the output node.

9. The method of claim 8, wherein the first and second transistors are of opposite types.

10. The method of claim 9, wherein:
    the first transistor is an n-type transistor; and
    the second transistor is a p-type transistor.

11. The method of claim 8, wherein:
    the first supply voltage is a voltage difference between the high supply voltage and the low supply voltage; and
    the second supply voltage is the high supply voltage.

12. The method of claim 8, wherein:
    the input signal is inverted in the low-voltage domain; and
    the inverted input signal is applied to a lower plate of the capacitor.

13. The method of claim 8, wherein the output signal is inverted in the high-voltage domain.

14. The method of claim 10, wherein:
    the level shifter has first and second branches;
    the first branch comprises the capacitor and the first and second transistors;
    the second branch comprises:
       a third transistor whose channel is connected between the second supply voltage and the output node and whose gate is connected to the upper plate of the capacitor; and
       a fourth transistor whose channel is connected between the output node and ground and whose gate is connected to the lower plate of the capacitor.

15. The method of claim 14, wherein:
    the first and fourth transistors are n-type transistors;
    the second and third transistors are p-type transistors;
    the first supply voltage is a voltage difference between the high supply voltage and the low supply voltage;
    the second supply voltage is the high supply voltage; and
    further comprising an inverter in the low-voltage domain and connected between the input node and the lower plate of the capacitor.

* * * * *